United States Patent
Roberts et al.

(10) Patent No.: US 6,628,136 B2
(45) Date of Patent: *Sep. 30, 2003

(54) METHOD AND APPARATUS FOR TESTING A SEMICONDUCTOR PACKAGE

(75) Inventors: Stuart L. Roberts, Boise, ID (US); Larry D. Kinsman, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/389,869

(22) Filed: Sep. 2, 1999

(65) Prior Publication Data
US 2002/0024350 A1 Feb. 28, 2002

(51) Int. Cl.7 .................................. G01R 31/26
(52) U.S. Cl. .................................. 324/765
(58) Field of Search ................ 324/754, 755, 324/757, 758, 765; 174/260, 267, 255, 261; 361/748, 760, 767, 768, 771, 777, 779; 439/66

(56) References Cited

U.S. PATENT DOCUMENTS

| | | | |
|---|---|---|---|
| 4,144,648 A | * 3/1979 | Grovender | 439/331 |
| 4,652,973 A | * 3/1987 | Baker et al. | 361/395 |
| 4,932,883 A | * 6/1990 | Hsia et al. | 439/66 |
| 5,206,585 A | * 4/1993 | Chang et al. | 324/754 |
| 5,420,460 A | * 5/1995 | Massingill | 257/693 |
| 5,440,240 A | * 8/1995 | Wood et al. | 324/765 |
| 5,477,160 A | * 12/1995 | Love | 324/755 |
| 5,495,179 A | * 2/1996 | Wood et al. | 324/755 |
| 5,543,724 A | * 8/1996 | Christopher | 324/754 |
| 5,759,047 A | * 6/1998 | Brodsky et al. | 439/66 |
| 5,766,979 A | * 6/1998 | Budnaitis | 438/15 |
| 5,777,391 A | * 7/1998 | Nakamura et al. | 257/778 |
| 6,027,346 A | * 2/2000 | Sinsheimer et al. | 439/66 |
| 6,181,567 B1 | * 1/2001 | Roemer et al. | 361/760 |
| 6,281,044 B1 | * 8/2001 | VanNortwick | 438/111 |

* cited by examiner

*Primary Examiner*—Kamand Cuneo
*Assistant Examiner*—Russell M. Kobert
(74) *Attorney, Agent, or Firm*—Dickstein Shapiro Morin & Oshinsky LLP

(57) ABSTRACT

A semiconductor testing system includes a compliant layer formed on a testing surface. Projections from the compliant layer form an electrical path to an electrical ground from a testing surface to a plurality of recessed ball pads disposed on a surface of a substrate. Thus, a plurality of electrical connections between a semiconductor die on the substrate and the ball pads may be tested for proper ground during a wirebonding process.

37 Claims, 6 Drawing Sheets

METHOD AND APPARATUS FOR TESTING A SEMICONDUCTOR PACKAGE

BACKGROUND OF THE INVENTION

The present invention relates generally to semiconductor packages, and more particularly to a method and apparatus for enabling wirebond testing of a semiconductor package.

In integrated circuit ("IC") manufacturing and packaging, a semiconductor die is formed on a substrate and interconnected to the substrate by wires or leads to form a complete circuit. Recently, yields of semiconductor devices have increased and large arrays of electronic circuits have been produced on a single semiconductor substrate. These circuit arrays typically require a large number of external connections.

In one known packaging method, the integrated circuit chip package includes a metal substrate, such as a lead frame, that electrically connects the semiconductor die to external pins of the package. In this method, the lead frame and external pins are etched or stamped directly from metal. However, as integrated circuits have become smaller and more complex, the number of external pins from the package has increased. Thus, conventional metal lead frames are no longer practical for packages which demand a relatively high pin count.

One such technique for assembling integrated circuit packages to achieve high pin counts is wirebonding. In wirebonding, a plurality of bond wires are attached one at a time from a bond pad on the semiconductor die to a corresponding bond pad on the substrate. The substrate is then connected to a printed circuit board.

Wirebonding may be used in ball grid array ("BGA") packaging. Typically, the ball grid array package includes a surface with ball pads for receiving solder balls. The solder balls are reflowed to provide electrical communication between the semiconductor die and the attached printed circuit board. The solder balls are designed to be mounted onto a plurality of corresponding terminal connections located on the surface of the printed circuit board.

During the wirebond process, the wirebonds are tested by a wirebonding test system. For example in a BGA, the wirebond forms an electrical path between the bond pad on the semiconductor die and the ball pad on the substrate. Typically, all of the electrical paths are shorted together. During this time, a current is applied to the electrical path to insure that the shorted paths are electrically grounded.

In some cases, the wirebond connections are not shorted together. In such a case, only the first wirebond is tested to insure sufficient grounding. One disadvantage to this technique is that subsequent wirebond connections are not tested. As a result, a faulty connection may be missed and cause the circuit to malfunction. Further, the ball pads may be recessed from a surface of the BGA package. These ball pads are isolated from an electrical ground. For example, a non-conductive masking layer applied to the surface of the package may block the electrical path between the bond pad and ground. The masking layer may only be etched to expose the ball pads. Yet, a separation layer equal to the thickness of the masking layer is still present between the package and the electrical ground. During the testing process, the isolated wirebonds may not be sufficiently tested or overlooked. This may result in faulty wirebond connections, and a reduced yield of the resulting semiconductor devices.

Therefore, a need exists for a method and apparatus that is capable of sufficiently connecting a pluarlity of wirebonds to an electrical ground during a wirebond testing process.

SUMMARY OF THE INVENTION

In general, the present invention is directed to an apparatus for testing a semiconductor package that includes a layer of compliant material positioned between a grounded testing surface and a plurality of ball pads. The compliant layer forms a plurality of electrical paths to ground the ball pads in the presence of an applied electrical signal.

Accordingly, in one aspect, the apparatus includes a testing surface connected to a ground. A substrate is positioned relative to the testing surface, and includes a plurality of ball pads and at least one semiconductor die disposed thereon. A layer of compliant material is positioned between the testing surface and the ball pads to form at least one electrical path between the semiconductor die and a ground through one of the plurality of ball pads. The electrical path is grounded in the presence of an applied electrical signal.

Implementations of the invention include one or more of the following. The plurality of ball pads may be formed from copper plated with nickel and gold or palladium. The compliant layer may be attached to the testing surface by an adhesive material, recessed cutout, or press fit. A portion of the substrate may be connected to circuit test equipment to supply the applied electrical signal. The semiconductor package may be a ball grid array package. The semiconductor die may be electrically connected to the substrate by wirebonding. The compliant layer may include a plurality of projections for contacting selected ones of the plurality of ball pads to form a plurality of electrical contacts therebetween. The substrate may include a plurality of holes for receiving at least one of the plurality of projections to secure or align the substrate to the compliant layer. The ball pads and the semiconductor die may be located on the same side of the substrate. The plurality of ball pads may be recessed from a surface of the substrate. Alternatively, the ball pads and the semiconductor die may be positioned on opposite sides of the substrate.

In another aspect, the invention is directed to a method for testing a semiconductor package that incudes providing a testing surface connected to a ground. A layer of compliant material is formed on a portion of the testing surface, and a substrate is positioned onto a surface of the compliant layer to form an electrical path between at least one semiconductor die on the substrate and ground through one of a plurality of bond pads formed on a surface of the substrate.

Implementations of the invention include one or more of the following. An electrical signal may be applied to the at least one electrical path to determine if the electrical path is connected to ground. A plurality of projections may be formed on a surface of the compliant layer to contact selected ones of the plurality of ball pads. A terminal having a ground may be formed on a surface of the substrate.

Other advantages and features of the present invention will become apparent from the following description, including the drawings and claims.

DESCRIPTION OF THE PREFERRED EMBODIMENT

Figure 1A:
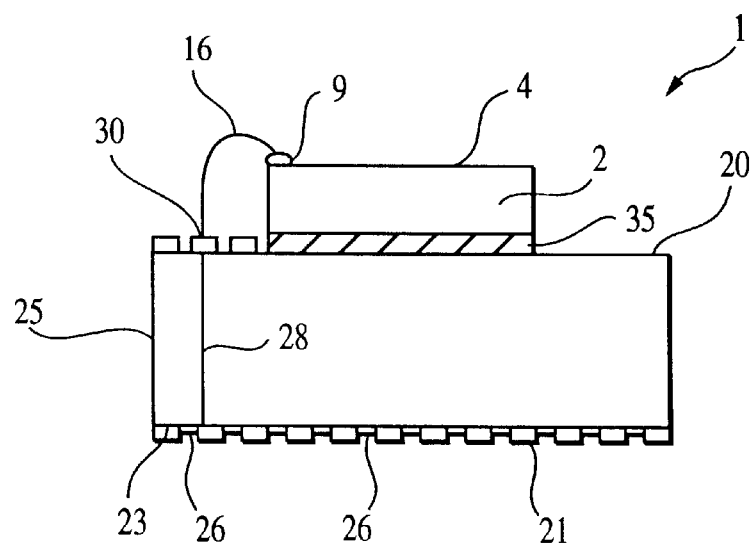
FIG. 1A illustrates a ball grid array package in accordance with a preferred embodiment.
Figure 1B:
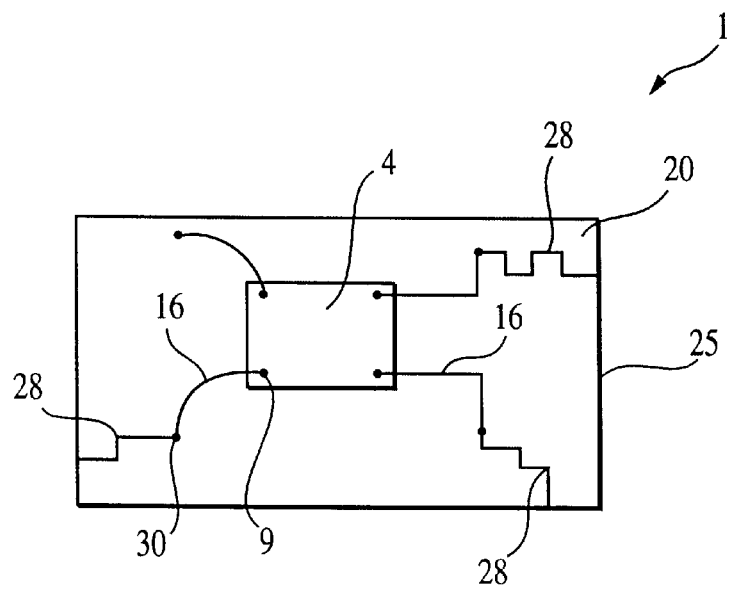
FIG. 1B is a top perspective view of the ball grid array package of FIG. 1.

FIGS. 1A and 1B illustrate an implementation of a ball grid array ("BGA") package 1 in accordance with a preferred embodiment. The BGA package 1 includes a substrate 25. Substrate 25 may be an organic substrate, ceramic substrate, or other suitable material for semiconductor packaging and manufacturing. The BGA package 1 also includes a semiconductor die 2 having an active surface 4. Surface 4 may be mounted face-up or face-down relative to the substrate 25 by an adhesive 35. Suitable adhesives include a liquid or gel adhesive, a heat-conducted adhesive or any adhesive tape. The semiconductor die 2 includes a plurality of bond pads 9 mounted on the active surface 4. In a face-down configuration, a window or slot may be provided to aid in the bonding process. The BGA package 1 may include a plurality of semiconductor dice 2 formed on substrate 25. For simplicity, only one semiconductor die 2 will be discussed. The semiconductor die 2 may be a transistor, microprocessor, or other suitable die structures.

Substrate 25 includes a plurality of bond pads 30, a plurality of ball pads 26, a plurality of circuit traces 28, a top surface 20, and a bottom surface 23. Each bond pad 30 is preferably in electrical communication with a corresponding ball pad 26 via at least one circuit trace 28, as discussed below. Circuit traces 28 may be formed onto the top surface 20 or bottom surface 23 by etching or other suitable techniques. Bond pads 30 and ball pads 26 may be formed onto top surface 20 or bottom surface 23 by etching or other suitable techniques. Bond pads 30 and ball pads 26 may be formed from an electrically conductive material such as copper plated with nickel and gold, palladium, or other suitable material.

The bond pads 9 of semiconductor die 2 may be electrically connected to corresponding bond pads 30 on substrate 25 by electrical connections 16, such as a wirebond. Electrical connections 16 may be connected between bond pads 9 and 30 by wirebonding. Suitable wirebonding techniques include ultrasonic bonding, thermocompression bonding, and thermosonic bonding. Thermocompression bonding combines pressure and elevated temperature to form a weld. Thermosonic bonding combines pressure, elevated temperature, and ultrasonic vibration bursts to bond the wire. Ultrasonic wirebonding combines pressure and ultrasonic vibration bursts to form a metallurgical cold weld bond. The electrical connections 16 may be formed from gold, copper, or other suitable conductive material.

FIG. 1A illustrates ball pads 26 disposed on the bottom surface 23 of substrate 25 in a chip-on-board (COB) configuration. In this configuration, surface 4 of semiconductor die 2 is mounted face-up with respect to surface 20. Alternatively, ball pads 26 may be formed on the top surface 20 of substrate 25 and surface 4 is mounted face-down with respect to bottom surface 23 in a board-on-chip (BOC) configuration.

As shown in FIG. 1B, ball pads 26 are electrically connected to corresponding bond pads 9 via bond pads 30, circuit traces 28, and electrical connections 16 to form a plurality of electrical paths. Solder balls (not shown) for connecting to a corresponding terminal on a printed circuit board may be connected to ball pads 26. Ball pads 26 may be attached to the substrate 25 by an adhesive. A mold compound (not shown), such as a glob top, may also be formed over the semiconductor die 2 and electrical connection 16 to protect them during packaging.

Figure 2:
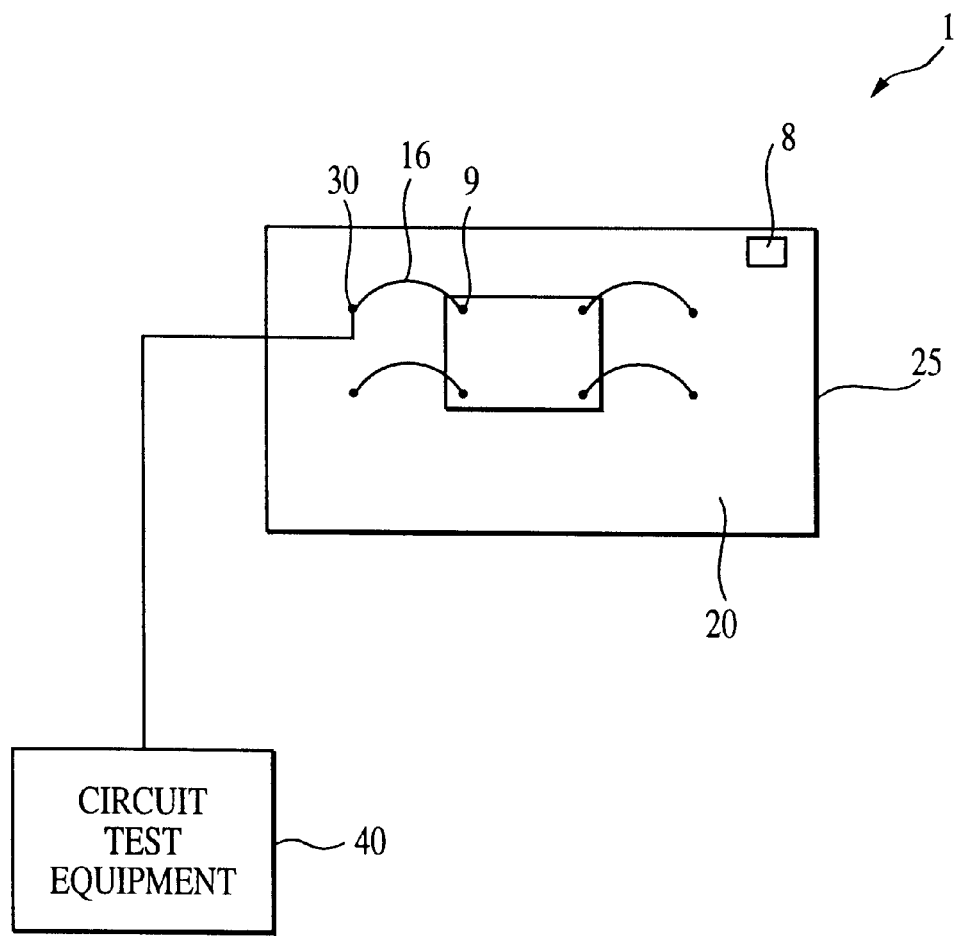
FIG. 2 illustrates circuit testing equipment connected to the ball grid array package of FIG. 1.

FIG. 2 shows that each electrical connection 16 is tested by circuit test equipment 40, for example, a wirebond testing system. Circuit test equipment 40 is connected to an electrical connection 16 to be tested. A current is then applied to the electrical connection by test equipment 40, and a determination is made as to whether the electrical connection is suitably grounded for a predetermined period of time. Alternatively, the wirebond system (not shown) can be configured to detach from a electrical connection 16 when sufficient ground is determined.

Figure 1C:
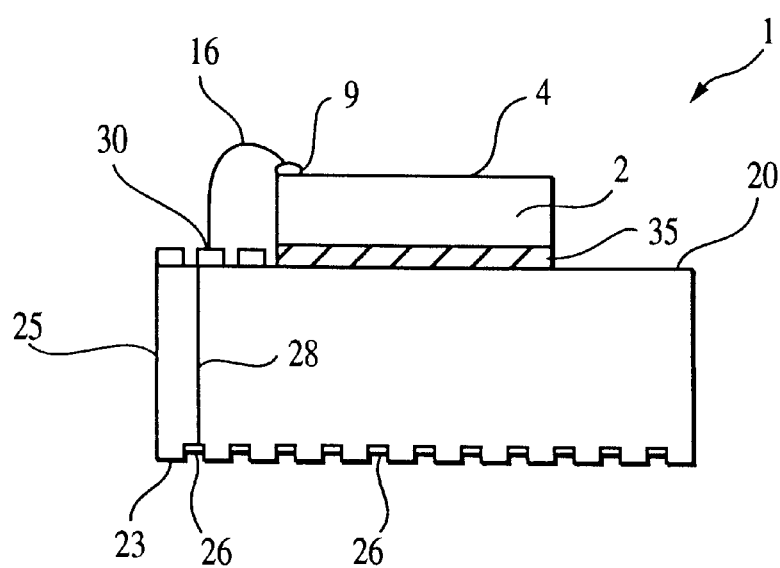
FIG. 1C shows a side view of another exemplary embodiment of the invention.

As shown in FIG. 1C, ball pads 26 may be recessed into bottom surface 23 of substrate 25 in the COB configuration. Alternatively, ball pads 26 may be recessed into top surface 20 in the BOG configuration. For example, the surface of the substrate 25, e.g., surface 20 or 23, may be covered with a non-conductive masking material 21 (FIG. 3) to protect components of the BGA package 1. The non-conductive layer of material 21 is then etched to only expose the ball pads 26. The remaining non-conductive material 21 forms a separation layer on the surface of the substrate 25. This means that the ball pads 26 are recessed by a distance substantially equal to the thickness of the applied non-conductive layer 21. The thickness of the masking layer 21 may be about 0.05 millimeters (0.002 inches). This configuration causes the ball pads 26, and thus electrical paths (e.g., 16, 28) to be separated from a suitable electrical ground. During the wirebond process, the above separated electrical paths (e.g., 28) cannot be accurately tested by a wirebond testing system. As a result, faulty electrical paths (e.g., 16, 28) may be missed causing poor performance of the resulting integrated circuit.

To form a sufficient ground connection for each electrical path, (e.g., 16, 28) the inventors have discovered that a compliant layer may be used to connect the recessed ball pads 26 to a common ground. In one configuration, a compliant layer may be attached to the surface of the testing equipment 40. Preferably, each electrical path (e.g., 16, 28) is grounded when the substrate surface containing the ball pads 26 contacts the compliant layer.

Figure 3:
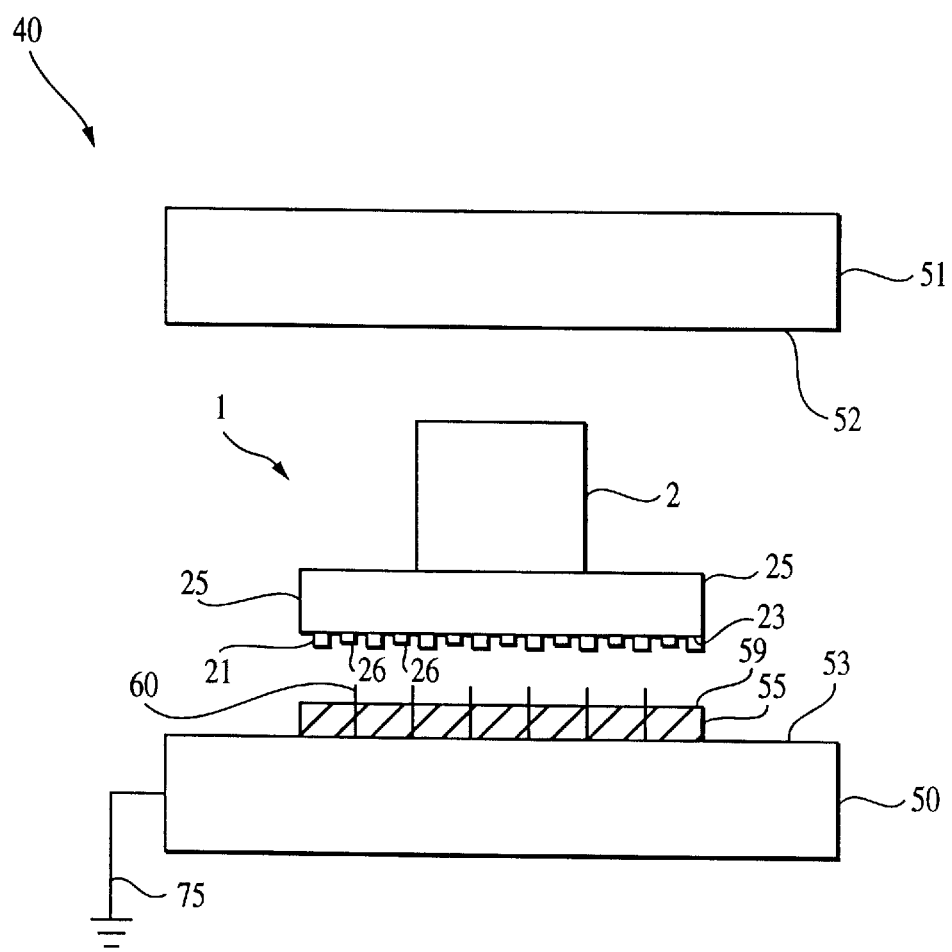
FIG. 3 illustrates a layer of a compliant material in accordance with a preferred embodiment.

FIG. 3 illustrates a portion of test equipment 40 that includes a heat block 50 and a clamp 51. Preferably, the package to be tested is positioned on heat block 50. In this configuration, bottom surface 23 is substantially parallel to top surface 53 of heat block 50. Heat block 50 is connected to ground 75.

A compliant layer 55 may be formed on a portion or across the entirety of top surface 53 of heat block 50. Preferably, this embodiment is used in a COB configuration. Alternatively, the compliant layer may be formed on a portion or across the entirety of bottom surface 52 of clamp 51. This embodiment may be suitable for BOC configurations. Compliant layer 55 functions in substantially the same manner and performs substantially the same functions in both embodiments. For simplicity, a COB configuration will be discussed below.

Compliant layer 55 may be formed from any suitable conductive material which forms an electrical contact between the ball pads 26 and the heat block 50. Suitable materials include conforming steel balls, z-axis conductive film, z-axis elastomeric conductive interconnect, steel wool, electric conductive fluid, pogo pins, rigid protrusions from heat block, interconnective tape, or interconnective foam tape. Compliant layer 55 may be attached to top surface 53 of heat block 50 by an adhesive material, recessed cutout, press fit, or other suitable technique. Compliant layer 55 may have a thickness suitable to form a connection through a non-conductive masking layer 21.

Figure 4:
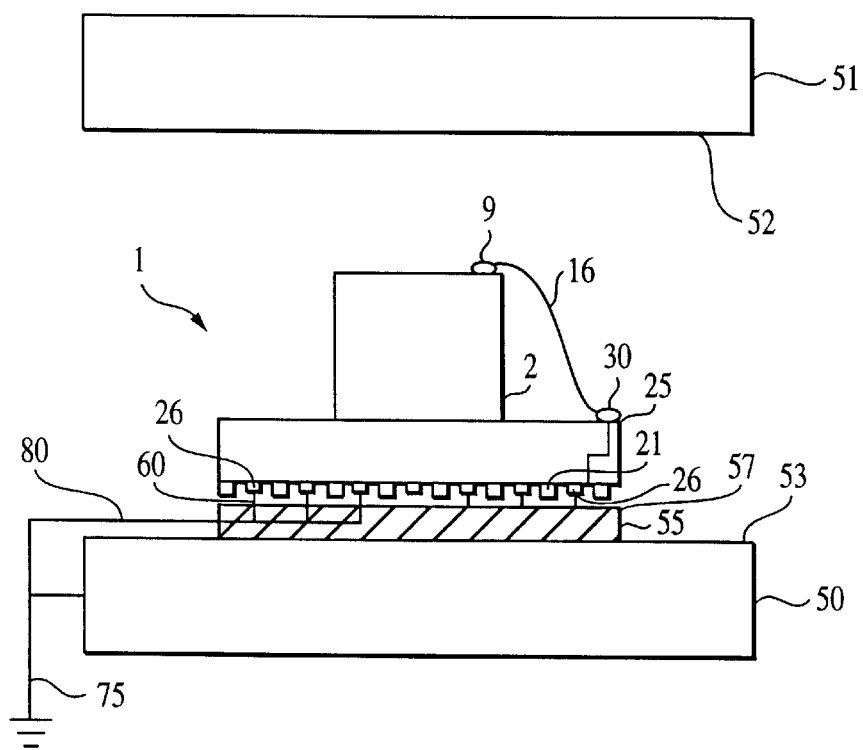
FIG. 4 is a side view of the layer of compliant contacting the ball grid array package of FIG. 1.

Referring now to FIG. 4, compliant layer 55 includes a plurality of projections 60 which extend from a top surface 57 of compliant layer 55. In this configuration, projections 60 align with a ball pad 26 on the bottom surface 23 to form an electrical connection. Alternatively, projections 60 may surround ball pads 26 and cover the exposed surface of ball pads 26. In this embodiment, the number of projections 60 may be substantially larger than the number of ball pads 26.

During the testing process, the substrate 25 is disposed onto the top surface 57 of compliant layer 55. The compliant layer 55 may be forced into and kept in constant contact with the ball pads 26 by an external load (not shown). For example, the clamp 51 is lowered during the wirebonding process to sandwich substrate 25. As shown in FIG. 4, compliant layer 55 is preferably connected to heat block 50 such that compliant layer 55 and heat block 50 are connected to ground 75. When ball pads 26 contact top surface 57, a plurality of electrical paths 80 are formed to connect ball pads 26 to ground 75. As a result, electrical paths 6 (FIG. 1A) are grounded via electrical path 80 during the testing procedure.

Figure 5:
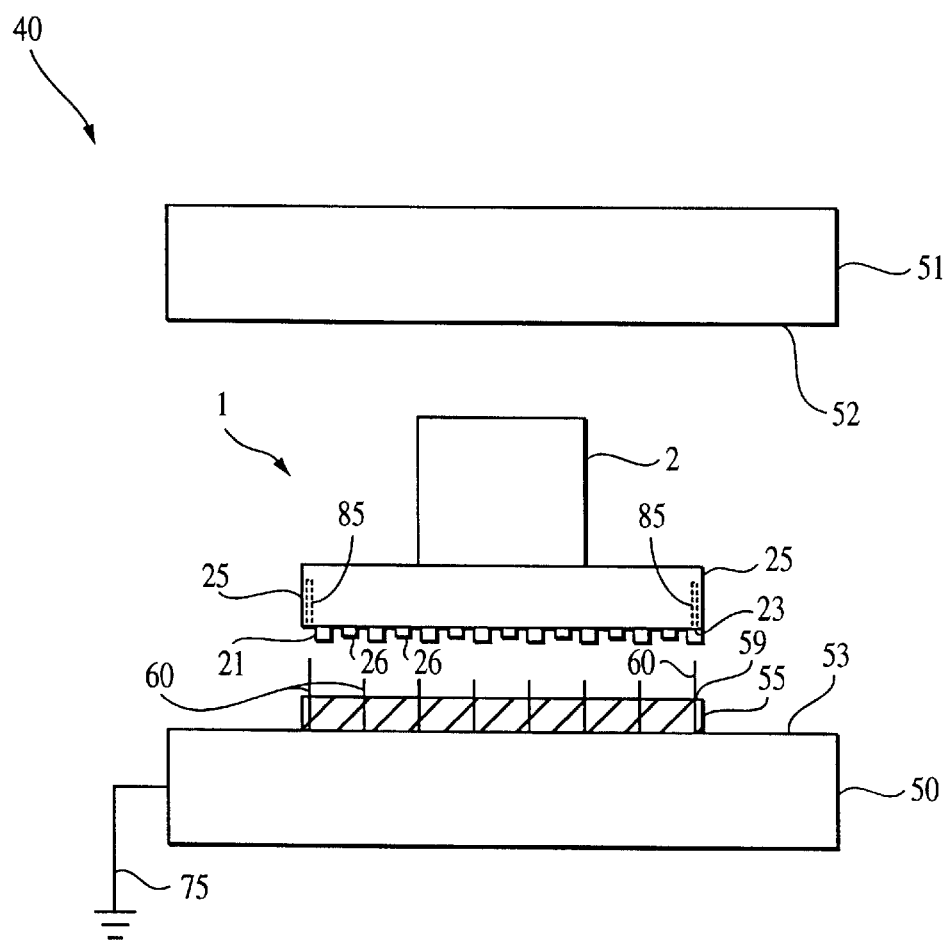
FIG. 5 shows a side view of another exemplary embodiment of the invention.

Referring to FIG. 5, substrate 25 may be aligned with or secured to surface 57 using a plurality of alignment holes 85 formed into substrate 57 to receive corresponding projections 60. Further, a terminal 8 (FIG. 2) may be formed onto a surface of the substrate 25 to provide a reference ground. This means that the current test equipment 40 can be reset before electrical connections 16 are tested. This increases the accuracy of the test because current leakage from a prior test is not observed in a subsequent test reading.

The present invention has been described in terms of number of embodiments. The invention, however, is not limited to the embodiments depicted and described. For example, the electrical connections 16 may be pre-formed between semiconductor die 2 and substrate 25 in one batch process.

What is claimed is:

1. An apparatus for testing a semiconductor package comprising:
    a heatblock having an upper surface that functions as a testing surface; and
    a layer of compliant material positioned on the testing surface;
    wherein said layer of compliant material is adapted to receive and contact a substrate including at least one die and a plurality of ball pads electrically coupled to the die, said contact being in a manner such that said layer of compliant material forms at least one electrical path between the at least one die and a compliant material through one of the plurality of ball pads.

2. The apparatus of claim 1, wherein the plurality of ball pads are formed from copper plated with nickel and gold or palladium.

3. The apparatus of claim 1, wherein the compliant layer is formed from conforming steel balls, z-axis conductive film, z-axis elastomeric conductive interconnect, steel wool, electric conductive fluid, pogo pins, rigid protrussions form heat block, interconnective tape, or interconnective foam tape.

4. The apparatus of claim 1, wherein a portion of the substrate is connected to circuit test equipment to supply an applied electrical signal to at least one electrical path.

5. The apparatus of claim 1, wherein the semiconductor package is a ball grid array package.

6. The apparatus of claim 1, wherein the plurality of ball pads are recessed from a surface of the substrate.

7. The apparatus of claim 1, wherein at least one semiconductor die is electrically connected to the substrate by wirebonding.

8. The apparatus of claim 1, wherein the compliant layer comprises a plurality of projections for contacting selected ones of the plurality of ball pads to form a plurality of electrical contacts therebetween.

9. The apparatus of claim 8, wherein the substrate further comprises a plurality of holes for receiving at least one of said plurality of projections to secure or align the substrate to the compliant layer.

10. The apparatus of claim 1, wherein the at least one electrical path comprises a wirebond connected between the at least one semiconductor die and the substrate.

11. The apparatus of claim 1, wherein the plurality of ball pads and the at least one semiconductor die are located on the same side of the substrate.

12. The apparatus of claim 1, wherein the plurality ball pads and the at least one semiconductor die are located on opposite sides of the substrate.

13. The apparatus of claim 1, wherein the plurality of ball pads are recessed from at least one layer formed on said surface of the substrate.

14. The apparatus of claim 13, wherein said layer comprises a nonconductive layer.

15. The apparatus of claim 1, wherein at least one portion of the testing surface is connected to a ground.

16. A method for testing a semiconductor package, comprising:
    providing a heatblock having an upper surface functioning as a testing surface;
    positioning a substrate relative to the testing surface, said substrate including a plurality of ball pads and at least one die electrically connected to the ball pads; and
    providing a layer of compliant material between the substrate and the testing surface to form at least one electrical path between said at least one die and the compliant material through one of the plurality of ball pads.

17. The method of claim 16, further comprising applying an electrical signal to the at least one electrical path to determine if the electrical path is connected to the ground.

18. The method of claim 16, wherein the semiconductor package is a ball grid array package.

19. The method of claim 16, where the forming step includes forming a plurality of projections on a surface of the compliant layer to contact selected ones of the plurality of ball pads.

20. The method of claim 16, wherein the plurality of ball pads are recessed from a surface of the substrate.

21. The method of claim 16, wherein forming step comprises forming the compliant layer from one of conforming steel balls, z-axis conductive film, z-axis elastomeric conductive interconnect, steel wool, electric conductive fluid, pogo pins, rigid protrusions form heat block, interconnective tape, or interconnective foam tape.

22. The method of claim 21, wherein the forming step further comprises attaching the compliant layer to the testing surface by an adhesive material, recessed cutout, or press fit.

23. The method of claim 16, further comprising forming a terminal having a ground on a surface of the substrate.

24. The method of claim 16, wherein the plurality of ball pads are recessed from a nonconductive layer formed on said surface of the substrate.

25. An apparatus for testing a semiconductor package comprising:
- a block having an upper surface that functions as a testing surface;
- a substrate comprising at least one semiconductor die and a plurality of ball pads electrically coupled to the die, wherein the plurality of ball pads are recessed from a surface of the substrate; and
- a layer of compliant material positioned on the testing surface;
- wherein said layer of compliant material is adapted to receive and contact said substrate, said contact is such that said layer of compliant material forms at least one electrical path between the at least one semiconductor die and the compliant material through one of the plurality of ball pads.

26. The apparatus of claim 25, wherein the plurality of ball pads are formed from copper plated with nickel and gold or palladium.

27. The apparatus of claim 25, wherein the compliant layer is formed from conforming steel balls, z-axis conductive film, z-axis elastomeric conductive interconnect, steel wool, electric conductive fluid, pogo pins, rigid conductive protrusions formed on a heat block, interconnective tape, or interconnective foam tape.

28. The apparatus of claim 25, wherein a portion of the substrate is connected to circuit test equipment to supply an applied electrical signal to at least one electrical path.

29. The apparatus of claim 25, wherein the semiconductor package is a ball grid array package.

30. The apparatus of claim 25, wherein the plurality of ball pads are recessed from at least one layer formed on said surface of the substrate.

31. The apparatus of claim 30, wherein said layer is comprised of a nonconductive material.

32. The apparatus of claim 25, wherein at least one semiconductor die is electrically connected to the substrate by wirebonding.

33. The apparatus of claim 25, wherein the compliant layer comprises a plurality of projections for contacting selected ones of the plurality of ball pads to form a plurality of electrical contacts therebetween.

34. The apparatus of claim 33, wherein the substrate further comprises a plurality of holes for receiving at least one of said plurality of projections to secure or align the substrate to the compliant layer.

35. The apparatus of claim 25, wherein the at least one electrical path comprises a wirebond connected between the at least one semiconductor die and the substrate.

36. The apparatus of claim 25, wherein the plurality of ball pads and the at least one semiconductor die are located on the same side of the substrate.

37. An apparatus for testing a semiconductor package comprising:
- a heatblock having an upper surface that functions as a testing surface;
- a substrate comprising at least one semiconductor die and a plurality of ball pads electrically coupled to the die; and
- a layer of compliant material positioned on the testing surface;
- wherein said layer of compliant material is adapted to receive and contact said substrate, said contact is such that said layer of compliant material forms at least one electrical path between the at least one semiconductor die and the compliant material through one of the plurality of ball pads.

* * * * *

UNITED STATES PATENT AND TRADEMARK OFFICE
CERTIFICATE OF CORRECTION

PATENT NO. : 6,628,136 B2
DATED : September 30, 2003
INVENTOR(S) : Stuart L. Roberts et al.

It is certified that error appears in the above-identified patent and that said Letters Patent is hereby corrected as shown below:

Title page,
Item [54], Title, "METHOD AND APPARATUS FOR TESTING A SEMICONDUCTOR PACKAGE" should read -- TESTING APPARATUS WITH COMPLIANT LAYER FOR TESTING A SEMICONDUCTOR PACKAGE AND METHOD FOR USING --

Column 1,
Line 66, "pluarlity" should read -- plurality --.

Column 2,
Line 39, "incudes" should read -- includes --.

Column 3,
Line 1, "compliant" should read -- compliant material --.

Column 4,
Line 13, "a" should read -- an --.
Line 64, "*materials" should read -- materials --.

Column 5,
Line 62, "form" should read -- from --.
Line 63, "heat block" should read -- the heatblock --.

Column 6,
Line 58, "form" should read -- from the heatblock --.

Signed and Sealed this

Third Day of August, 2004

JON W. DUDAS
*Acting Director of the United States Patent and Trademark Office*